US012119633B2

(12) United States Patent
Stifter, Jr. et al.

(10) Patent No.: US 12,119,633 B2
(45) Date of Patent: Oct. 15, 2024

(54) TAP OFF BOX

(71) Applicant: Starline Holdings, LLC, Canonsburg, PA (US)

(72) Inventors: Frank Joseph Stifter, Jr., Bridgeville, PA (US); Douglas Raymond Moore, Charlotte, NC (US); David Philip Marple, Canonsburg, PA (US); John Donald Berenbrok, Beaver, PA (US); Lucas Anthony Andrews, Clinton, PA (US); Edward James Schultz, Cuddy, PA (US)

(73) Assignee: Starline Holdings, LLC, Canonsburg, PA (US)

(*) Notice: Subject to any disclaimer, the term of this patent is extended or adjusted under 35 U.S.C. 154(b) by 641 days.

(21) Appl. No.: 17/368,340

(22) Filed: Jul. 6, 2021

(65) Prior Publication Data

US 2023/0009523 A1    Jan. 12, 2023

(51) Int. Cl.
*H05K 5/06* (2006.01)
*H02B 1/28* (2006.01)
*H02G 5/08* (2006.01)

(52) U.S. Cl.
CPC .............. *H02G 5/08* (2013.01); *H05K 5/061* (2013.01)

(58) Field of Classification Search
CPC .... H01R 25/145; H01R 25/142; H05K 5/061; H02G 5/08; H02G 5/04; H02B 1/28
See application file for complete search history.

(56) References Cited

U.S. PATENT DOCUMENTS

| 3,716,683 | A | * | 2/1973 | Hafer | H01R 25/165 |
| | | | | | 200/50.28 |
| 3,793,562 | A | * | 2/1974 | Cleaveland | H02B 11/167 |
| | | | | | 361/678 |
| 10,122,161 | B2 | * | 11/2018 | Baldwin | H02G 5/08 |
| 2015/0236462 | A1 | * | 8/2015 | Davidson, Jr. | H01R 25/142 |
| | | | | | 439/122 |
| 2016/0234953 | A1 | * | 8/2016 | Ellingson | H05K 5/061 |
| 2018/0323560 | A1 | * | 11/2018 | Wynnik | H02G 5/025 |
| 2019/0097399 | A1 | * | 3/2019 | Baldwin | H01R 25/142 |
| 2022/0028635 | A1 | * | 1/2022 | Sadowski | H02G 5/08 |
| 2022/0181095 | A1 | * | 6/2022 | Garcia | H01H 85/205 |

FOREIGN PATENT DOCUMENTS

CN       210577358 U  *  5/2020
WO   WO-2012032381 A2  *  3/2012  ............... H01H 9/22

* cited by examiner

*Primary Examiner* — Hoa C Nguyen
*Assistant Examiner* — Amol H Patel
(74) *Attorney, Agent, or Firm* — McCarter & English, LLP

(57) ABSTRACT

An example tap off box is provided that includes a housing, a circuit breaker, a door, and a breaker actuator. The housing includes walls forming an internal enclosure. The circuit breaker is disposed within the housing. The door is secured to the housing to define a housing assembly, the housing assembly enclosing the circuit breaker. The breaker actuator includes a distal end and a proximal end, the distal end coupled to the circuit breaker within the housing assembly, and the proximal end extending outside of the housing assembly. The breaker actuator is capable of being moved at the proximal end to selectively toggle the circuit breaker from at least an ON position to an OFF position.

20 Claims, 4 Drawing Sheets

TAP OFF BOX

TECHNICAL FIELD

The present disclosure provides an advantageous tap off box for use with busway systems, and particularly to a tap off box that allows for user interaction with internal components of the tap off box without compromising the IP-55 (e.g., NEMA Type 3X standard) and liquid and dust resistant standard of the housing.

BACKGROUND

Busway systems generally include channels electrically connected to an end feed junction box that provides electrical power along the channels. The channels include openings capable of electrically receiving a tap off box that can be used to connect cables to the busway system. The cable is powered by the tap off box which, in turn, is powered by the end feed junction box.

Busway systems may be installed in harsh environments that may include dust and/or liquid infiltration. Traditional tap off boxes generally include a panel or door that must be opened by the user to access and adjust internal electrical components of the tap off box. Such opening of the panel or door compromises the potentially liquid and/or dust resistant housing of the tap off box, which can result in potential damage to the internal electrical components.

A need exists for a tap off box that allows for adjustment of internal electrical components while maintaining the IP-55 and dust and liquid resistant industry standard.

SUMMARY

Embodiments of the present disclosure provide an exemplary tap off box for use with busway systems that allows for selective adjustment or actuation of internal electrical components without opening the sealed housing. The tap off box includes one or more circuit breakers within the internal enclosure formed by a door coupled and sealed to a housing. The tap off box includes breaker actuators mechanically coupled to the respective circuit breakers inside of the sealed housing assembly, with proximal ends of the breaker actuators extending out of the housing assembly in a sealed manner. The proximal ends can be moved outside of the housing assembly without opening the door of the sealed housing, allowing for actuation of the circuit breakers inside of the housing assembly. The electronic internal components can therefore be maintained in a dust and liquid safe environment within the sealed housing assembly.

In accordance with embodiments of the present disclosure, an exemplary tap off box is provided. The tap off box includes a housing, a circuit breaker, a door, and a breaker actuator. The housing includes walls forming an internal enclosure. The circuit breaker is disposed within the housing. The door is secured to the housing to define a housing assembly, the housing assembly enclosing the circuit breaker. The breaker actuator includes a distal end and a proximal end, the distal end coupled to the circuit breaker within the housing assembly, and the proximal end extending outside of the housing assembly. the breaker actuator is capable of being moved at the proximal end to selectively toggle the circuit breaker from at least an ON position to an OFF position.

The breaker actuator is capable of being moved at the proximal end to selectively toggle the circuit breaker from at least the ON position to the OFF position without removing the door from the housing. The door secured to the housing forms a seal capable of restricting ingress of dust and liquid according to, e.g., a NEMA Type 3X rating, or the like. The housing can include a top wall, a bottom wall, a left side wall, a right side wall, and a rear wall. The top wall can include an opening configured to receive cables therethrough from a power distribution paddle head. The power distribution paddle head can be rotatably disposed outside of the housing assembly and including cables extending into the housing assembly, the cables electrically coupled to the circuit breaker. The power distribution paddle head can include paddles extending laterally from a body, the paddles configured to electrically engage with phase conductors of a busway of a busway system. The tap off box can include a ground plate disposed between the power distribution paddle head and a top surface of the housing.

The breaker actuator can be capable of being moved in a vertical up and down direction to selectively toggle the circuit breaker from at least the ON position to the OFF position. The breaker actuator can be capable of being moved to selectively toggle the circuit breaker from the ON position to a trip position, and from the OFF position to the trip position. The tap off box can include an internal wall removably coupled to the housing to encase the circuit breaker within the internal enclosure formed by the housing. The internal wall can be configured and dimensioned complementary to internal walls of the housing to create a seal with the housing around a perimeter of the internal wall. The tap off box can include a breaker cover positioned at least partially on the proximal end of the breaker actuator. The tap off box can include a cable seal assembly mounted to the door, the cable seal assembly including a body and one or more sections capable of being selectively removed from the body to accommodate passage of a cable therethrough.

In accordance with embodiments of the present disclosure, an exemplary method of controlling a tap off box is provided. The method includes providing a tap off box. The tap off box includes a housing including walls forming an internal enclosure, a circuit breaker disposed within the housing, a door secured to the housing to define a housing assembly, the housing assembly enclosing the circuit breaker, and a breaker actuator including a distal end and a proximal end, the distal end coupled to the circuit breaker within the housing assembly, and the proximal end extending outside of the housing assembly. The method includes moving the breaker actuator at the proximal end to selectively toggle the circuit breaker from at least an ON position to an OFF position. The breaker actuator is moved at the proximal end to selectively toggle the circuit breaker from at least the ON position to the OFF position without removing the door from the housing.

In accordance with embodiments of the present disclosure, an exemplary busway system is provided. The system includes a busway and a tap off box configured to be electrically and mechanically coupled to the busway. The tap off box includes a housing, a circuit breaker, a door, and a breaker actuator. The housing includes walls forming an internal enclosure. The circuit breaker is disposed within the housing. The door is secured to the housing to define a housing assembly, the housing assembly enclosing the circuit breaker. The breaker actuator includes a distal end and a proximal end, the distal end coupled to the circuit breaker within the housing assembly, and the proximal end extending outside of the housing assembly. The breaker actuator is capable of being moved at the proximal end to selectively toggle the circuit breaker from at least an ON position to an OFF position.

The busway can include an open channel extending along a bottom surface of the busway. The tap off box can include a power distribution paddle head rotatably disposed outside of the housing assembly and including cables extending into the housing assembly, the cables electrically coupled to the circuit breaker. The power distribution paddle head can be configured to be at least partially inserted into the open channel of the busway, and the paddles are configured to electrically engage with phase conductors of the busway. The busway system can include an end feed coupled to an end of the busway, the end feed supplying power to the busway and to the tap off box.

Any combination and/or permutation of embodiments is envisioned. Other objects and features will become apparent from the following detailed description considered in conjunction with the accompanying drawings. It is to be understood, however, that the drawings are designed as an illustration only and not as a definition of the limits of the present disclosure.

BRIEF DESCRIPTION OF THE DRAWINGS

To assist those of skill in the art in making and using the tap off box, reference is made to the accompanying figures, wherein.

DETAILED DESCRIPTION

Figure 1:
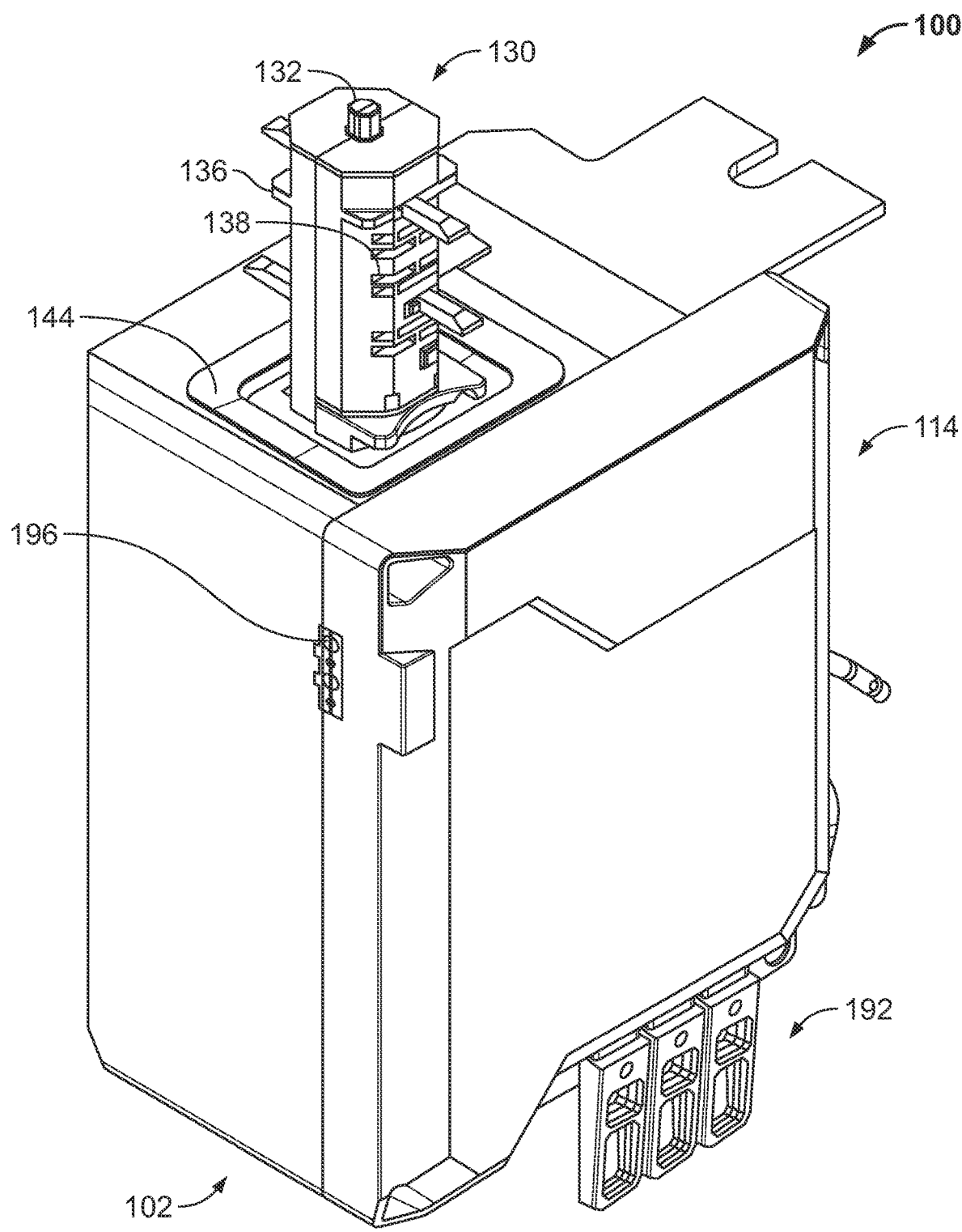
FIG. 1 is a perspective view of an exemplary tap off box of the present disclosure.
Figure 2:
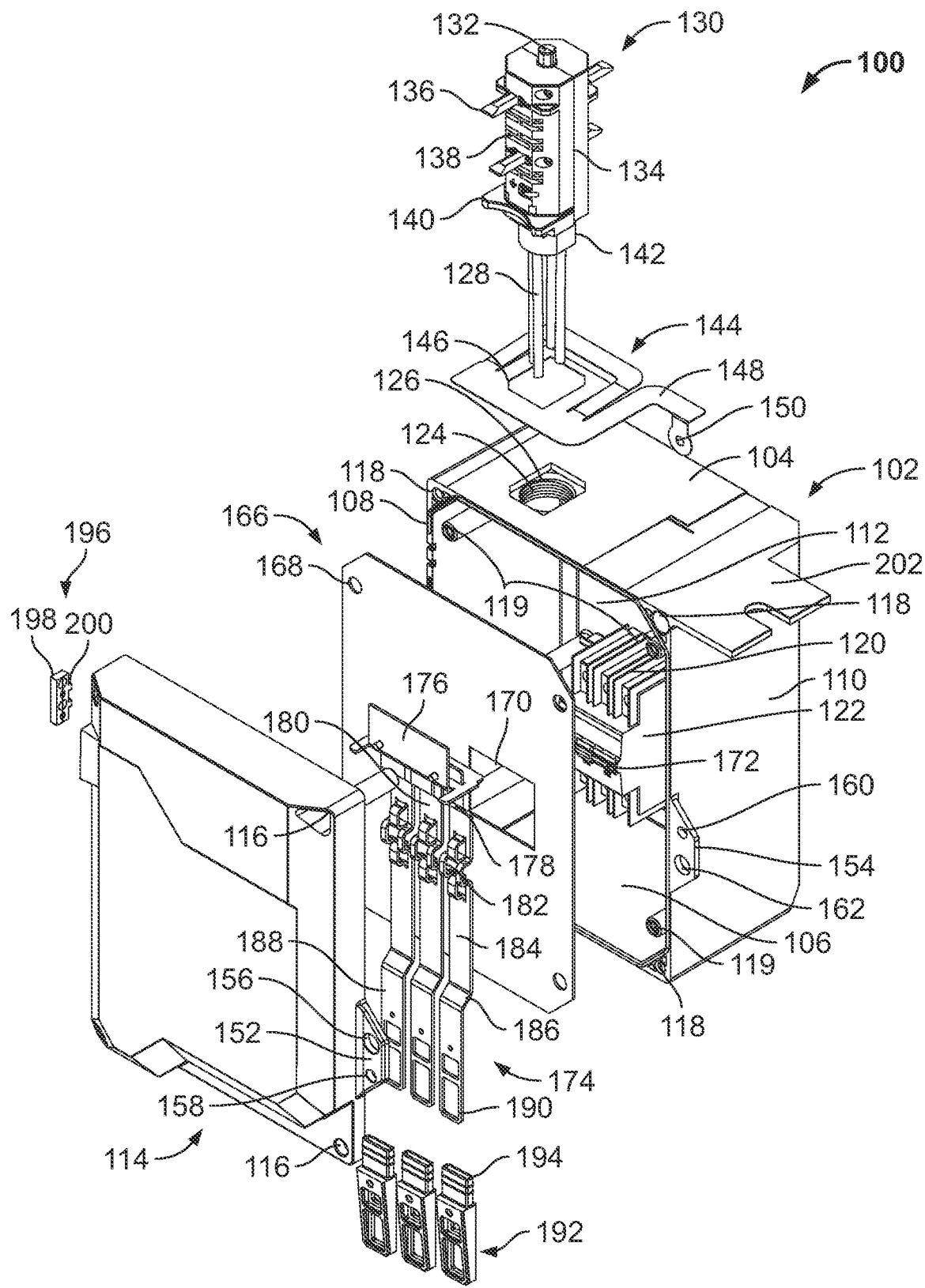
FIG. 2 is an exploded view of the exemplary tap off box of FIG. 1.

FIGS. 1 and 2 are perspective view and exploded views of an exemplary tap off box 100 of the present disclosure. The tap off box 100 generally includes a housing 102 including a top wall 104, a bottom wall 106, a left side wall 108, a right side wall 110, and a rear wall 112. The walls 104, 106, 108, 110, 112 form an internal enclosure configured to receive internal components of the tap off box 100. In some embodiments, the housing 102 can define a substantially rectangular or square configuration, with the top and bottom walls 104, 106 extending substantially parallel to each other, and the side walls 108, 110 extending substantially parallel to each other. However, it should be understood alternative configurations of the housing 102 are envisioned. The housing 102 can include a mounting bracket 202 extending from the top wall 104 away from the right side wall 110.

The tap off box 100 includes a door 114 (e.g., a lid, a cover, or the like) configured to be engaged with the housing 102 such that edges of the door 114 substantially align with and seal the interior of the housing 102 based on IP-55 or NEMA Type 3X industry standards. In particular, at a minimum, with the door 114 in the closed position against the housing 102, the assembly is capable of providing protection of the internal components within the housing 102 against ingress of solid foreign objects (e.g., dirt, dust, combinations thereof, or the like), provides protection with respect to harmful effects from ingress of moisture (e.g., water, rain, sleet, snow, combinations thereof, or the like), provides protection against corrosion, and further prevents damage from external formation of ice on the housing 102. The door 114 can include openings 116 at each of the corners of the door 114 through which a fastener (e.g., a bolt or screw) can be passed. The housing 102 includes corresponding internally threaded holes 118, allowing the door 114 to be secured to the housing 102. Tightening of the fasteners ensures the door 114 is securely sealed along the perimeter of the door 114 to the housing 102 to maintain the dust and water resistance. In some embodiments, rather than fasteners, the door 114 can be hingedly mounted to the housing 102 and a locking latch can be used to maintain the door 114 in the closed position. Securing the door 114 to the housing 102 forms a housing assembly.

The tap off box 100 includes one or more circuit breakers 120 mounted within the enclosure formed by the housing 102. A mounting bracket 122 can be configured to securely receive each of the circuit breakers 120 in a spaced manner, and the bracket 122 can be secured to one or more walls of the housing 102. The top wall 104 of the housing 102 includes an opening 124 formed therein and extending into the enclosure formed by the housing 102. The opening 124 can include one or more sealing elements 126 configured to maintain a seal around cables 128 extending through the opening 124, ensuring the dust and water resistance is maintained by the housing 102. In some embodiments, the tap off box 100 can include the circuit breakers 120, receptacles, meters, combinations thereof, or the like, within the enclosure, and the housing 102 and door 114 maintain the dust and water resistance to protect such internal components from undesired infiltration. In some embodiments, the housing 102 and door 114 can include a tamper proof protection feature in the form of brackets 152, 154 with corresponding openings 156, 158, 160, 162 which align and allow for passage of a lock therethrough when the door 114 is mated against the housing 102.

The tap off box 100 includes a power distribution paddle head 130 rotatably coupled to the housing 102. The head 130 includes a central post 132 extending through a body 134 of the head 130 along a central longitudinal axis, forming the axis of rotation of the head 130. The head 130 includes electrical contact blades or paddles 136 extending laterally from opposing sides of the body 134. The head 130 includes electrical elements 138 inside of the body 134 that electrically connect the paddles 136 to the cables 128. The electrical elements 138 can ensure that sufficient electrical creepage and clearance is achieved per UL requirements. The head 130 includes a guide plate 140 configured to act as a guide into a complementary slotted section in a bottom of the busway housing or channel when the power distribution paddle head 130 is rotated within the channel. Engagement of the guide plate 140 within the corresponding slotted section of the busway ensures that the paddles 136 of the paddle head 130 are successfully aligned with the housing conductors of the busway. The cables 128 extend from the bottom surface of the base 142 of the body 134, through the opening 124, and electrically connect to the circuit breakers 120. The base 142 can be configured and dimensioned to mate with the opening 124 to maintain the dust and water resistance of the housing 102. In use, at least a portion of the head 130 can be inserted into and rotated within an open channel busway of a busway system, resulting in electrical and physical engagement of the paddles 136 with phase conductors disposed within the busway. Electrical engagement between the paddles 136 and the phase conductors provides electrical power to the tap off box 100.

The tap off box 100 includes a ground plate 144 positioned between the head 130 and the top surface 104 of the housing 102. The ground plate 144 is fabricated from a metal or conductive material. The ground plate 144 includes a central opening 146 through which the cables 128 can pass. The ground plate 144 includes an extension 148 that extends from a main portion of the ground plate 144 along the plane defined by the main portion of the ground plate 144. The ground plate 144 includes a terminal 150 extending perpendicularly from the extension 148. The terminal 150 can be soldered to the housing 102 to ensure the ground plate 144 is grounded. During assembly of the tap off box 100 with the busway system, the ground plate 144 contacts a bottom surface or space at the open channel busway housing, and provides ground protection for the electrical devices (e.g., circuit breakers 120, or the like) disposed within the housing 102.

The tap off box 100 includes an internal plate or wall 166 mountable between the door 114 and the housing 102. The wall 166 defines a configuration complementary to the internal configuration of the housing 102 such that placement of the wall 166 within the housing 102 creates a seal around the perimeter of the wall 166 with the housing 102. The wall 166 includes openings 168 at each of the four corners corresponding with internally threaded openings 119 of the housing 102 (e.g., posts with threaded openings formed therein) such that fasteners can be used to secure the wall 166 to the housing 102 before the door 114 is secured to the housing 102. The wall 166 therefore adds additional sealing of the internal electrical components disposed within the enclosure formed by the housing 102. The wall 166 can define a generally planar structure, and includes a cutout 170 formed therein. When the wall 166 is assembled with the housing 102, the cutout 170 substantially aligns with and can at least partially receive therein switches 172 (e.g., breaker handles, or the like) of the respective circuit breakers 120.

The tap off box 100 includes one or more breaker actuators 174 corresponding to the number of circuit breakers 120 disposed within the housing 102. The breaker actuators 172 are movably or slidably mounted to the wall 166 with a mounting plate 176 at or near a distal end 178 of the breaker actuators 174. The breaker actuators 174 each define a substantially flat or planar section 180 at or near the distal end 178, include a raised engagement section 182 (e.g., a U-shaped extension), and another flat or planar section 184 connected to the end of the raised engagement section 182. The sections 180, 184 can extend along the same plane. Each breaker actuator 174 includes a tapered or angled section 186 connecting the planar section 184 to another flat or planar section 188 defining the proximal end 190 of the breaker actuator 174. The planar section 188 extends along a plane parallel to the plane defined by the sections 180, 184. The breaker actuators 174 are configured to extend through an opening or slot formed between the door 114 and the housing 102 such that from approximately the angled section 186, the breaker actuators 174 extend outside of the door 114 and housing 102 assembly. In some embodiments, the door 114 and/or housing 102 can include one or more sealing elements (e.g., gaskets, washers, or the like) configured to create a seal around the movably positioned breaker actuators 174. In some embodiments, actuator covers 192 (discussed below) positioned over endpoints of the breaker actuators 172 can provide a dynamic seal between the actuator covers 192 and the opening or slot between the door 114 and the housing 102, allowing for movement of the breaker actuators 172 to toggle the respective circuit breaker 120 while maintaining a seal between the noted components.

The engagement section 182 of the breaker actuators 172 is configured and dimensioned to at least partially receive, engage or couple with a respective switch 172 of the circuit breakers 120. In such engaged position, vertical movement or sliding of the breaker actuators 172 allows for selective toggling of the respective switch 172 of the circuit breaker 120 into the on, trip, or off position. The tap off box 100 includes actuator covers 192 including a slot 194 at the distal end configured to receive the proximal end 190 of the respective breaker actuators 172. An actuator cover 192 can thereby be positioned onto and secured to the proximal end 190 of the breaker actuators 172, with the actuator covers 192 extending outside of the door 114 and housing 102 assembly (e.g., the housing assembly), as well as through the opening between the door 114 and the housing 102 to create a seal with the opening. The actuator covers 192 are secured to the bottom end of the breaker actuators 172, and move with the breaker actuators 172 in the respective positions for actuating the circuit breakers 120. Extension of the breaker actuators 172 (and the actuator covers 192) outside of the housing assembly allows for toggling of the circuit breakers 120 into the desired positions from outside of the tap off box 100 without the need to remove the door 114. Actuation of the circuit breakers 120 is therefore possible without exposing the internal components of the tap off box 100 to dust, water and other undesired environmental elements (e.g., due to the seal created and maintained by the actuator covers 192), thereby maintaining the high ingress protection rating.

The tap off box 100 includes a cable seal assembly 196 that can be located on a side wall of the door 114. The cable seal assembly 196 includes a body 198 that can be removed from a complementary slot formed in the door 114. The body 198 includes sections 200 that can be selectively removed (e.g., cut out, punched out, or the like) to accommodate passage of one or more cables through the opening in the body 198. The cables can connect internal components of the tap off box 100 to metering devices, with the cable seal assembly 196 maintaining a seal around the cables to provide protection from dust and liquids. In some embodiments, a sealing element (e.g., washer, 0-ring, or the like) can be used to form the seal around cables passing through the cable seal assembly 196. The tap off box 100 therefore provides for convenient, selective actuation of the circuit breakers 120 disposed within the housing 102 without expose the internal components of the housing 102 to external elements.

Figure 3:
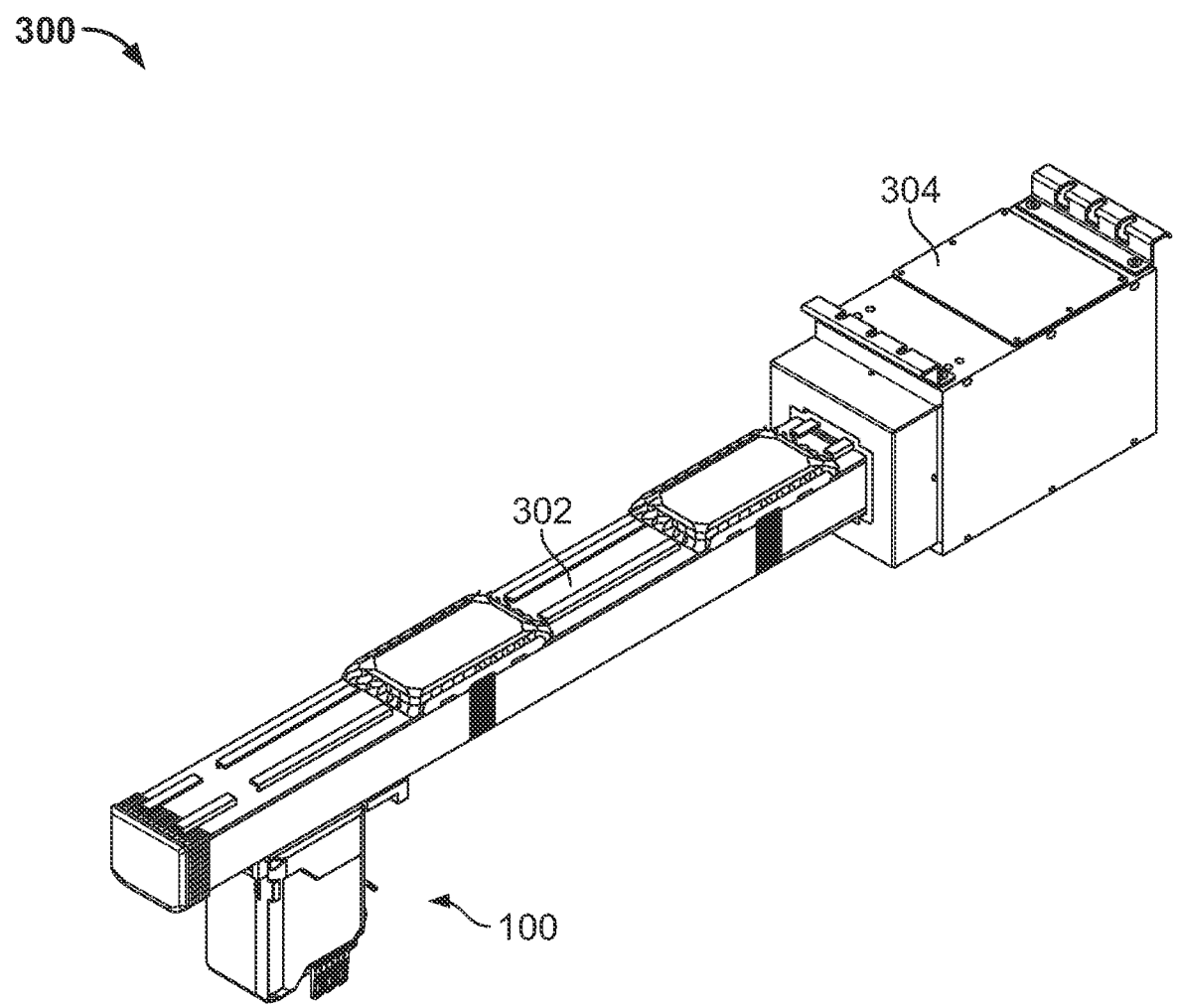
FIG. 3 is a perspective view of the exemplary tap off box of FIG. 1 electrically coupled to a busway system.
Figure 4:
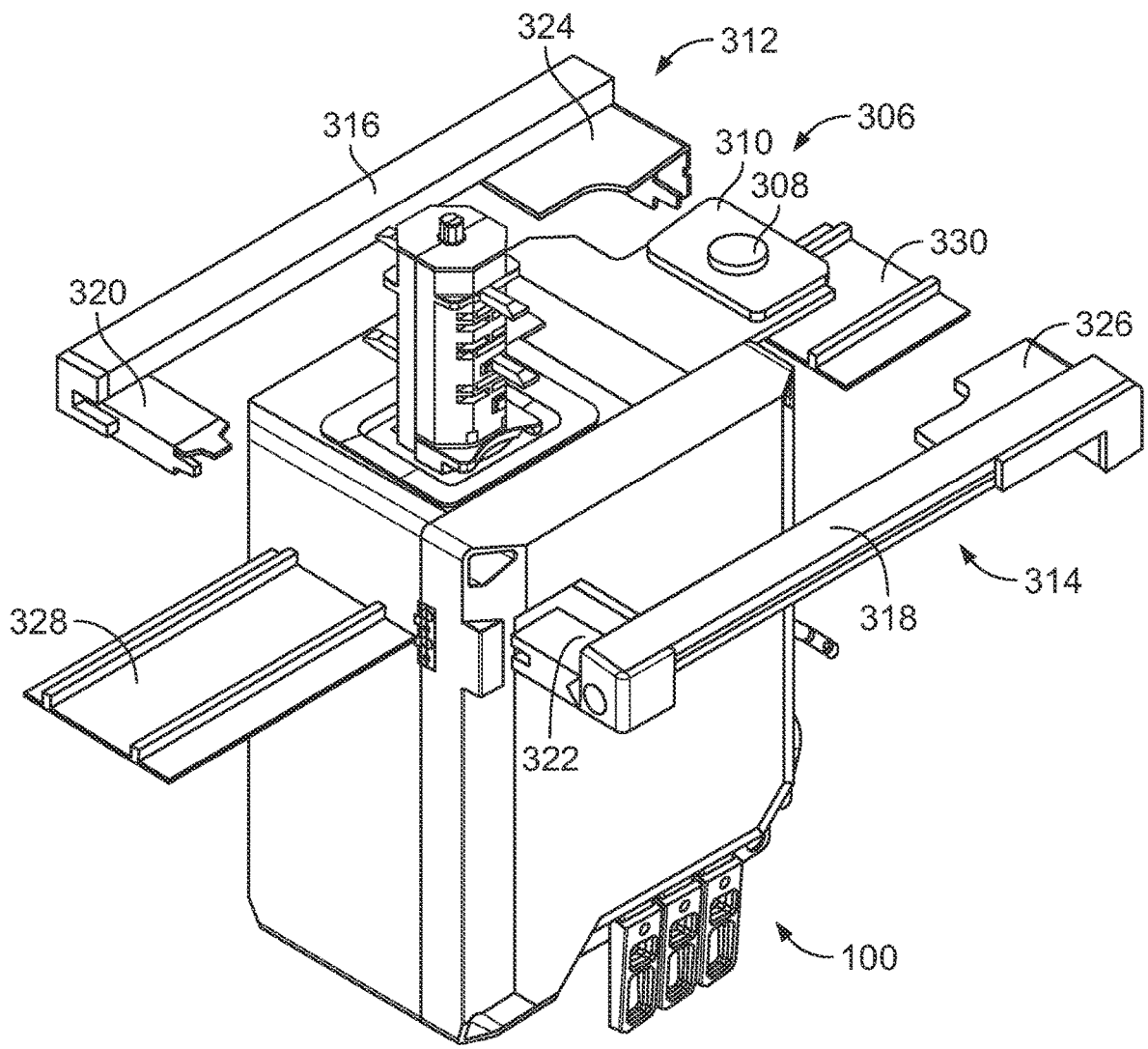
FIG. 4 is an exploded view of the exemplary tap off box of FIG. 1 including sealing elements for securing the tap off box to the busway system of FIG. 3.

FIG. 3 is a perspective view of the tap off box 100 electrically and mechanically coupled to a busway system 300, and FIG. 4 is an exploded view of the tap off box 100 including components for securing the tap off box 100 to the busway system 300. The busway system 300 includes an open channel truck busway 302 with an open slot extending along the bottom surface. An end feed 304 coupled to the end of the busway 302 supplies power to the busway 302. After the paddle head 130 of the tap off box 100 has been inserted into and rotated within the channel within the busway 302, a bolted plate assembly 306 including a plate 308 and a fastener 310 can be used to secure the tab off box 100 to the busway 302.

A sealing assembly including a first sealing element 312 and a second sealing element 314 can be positioned around the top of the tap off box 100 to ensure a proper seal is maintained between the tap off box 100 and the busway 302. Each sealing element 312, 314 can include a central bar 316, 318, a first set of perpendicular extensions 320, 322 configured to interlock with each other, and a second set of perpendicular extensions 324, 326 configured to interlock with each other. Engagement of the extensions 320, 322, 324, 326 relative to each other maintains the position of the sealing assembly relative to the tap off box 100 and the busway 302. Plastic covers 328, 330 can be secured to the bottom surface of the busway 302 to cover the remaining opening formed by the channel around the tap off box 100.

While exemplary embodiments have been described herein, it is expressly noted that these embodiments should not be construed as limiting, but rather that additions and modifications to what is expressly described herein also are included within the scope of the invention. Moreover, it is to be understood that the features of the various embodiments described herein are not mutually exclusive and can exist in various combinations and permutations, even if such combinations or permutations are not made express herein, without departing from the spirit and scope of the invention.

The invention claimed is:

1. A tap off box, comprising:
a housing including walls forming an internal enclosure;
circuit breakers disposed within the housing;
a door secured to the housing to define a housing assembly, the housing assembly enclosing the circuit breakers and forming a seal around the circuit breakers that is capable of restricting ingress of dust and liquid into the housing assembly;
breaker actuators each including a distal end and a proximal end, the distal end coupled to the respective circuit breaker of the circuit breakers within the housing assembly, and the proximal end extending outside of the housing assembly;
wherein the breaker actuators are capable of being moved at the proximal end to selectively toggle the respective circuit breaker associated with the breaker actuator from at least an ON position to an OFF position without compromising the seal formed by the housing assembly around the circuit breakers.

2. The tap off box of claim 1, wherein the breaker actuators are capable of being moved at the proximal end to selectively toggle the respective circuit breaker of the circuit breakers from at least the ON position to the OFF position without removing the door from the housing.

3. The tap off box of claim 1, wherein the seal formed by the door is capable of restricting ingress of the dust and the liquid according to a NEMA Type 3X rating.

4. The tap off box of claim 1, wherein the housing includes a top wall, a bottom wall, a left side wall, a right side wall, and a rear wall.

5. The tap off box of claim 4, wherein the top wall includes an opening configured to receive cables therethrough from a power distribution paddle head.

6. The tap off box of claim 1, comprising a power distribution paddle head disposed outside of the housing assembly, and the power distribution paddle head including cables extending into the housing assembly, the cables electrically coupled to the circuit breakers.

7. The tap off box of claim 6, wherein the power distribution paddle head includes paddles extending laterally from a body, the paddles configured to electrically engage with phase conductors of a busway of a busway system.

8. The tap off box of claim 6, comprising a ground plate disposed between the power distribution paddle head and a top wall of the housing.

9. The tap off box of claim 1, wherein the breaker actuators are capable of being moved in a vertical up and down direction to selectively toggle the respective circuit breaker of the circuit breakers from at least the ON position to the OFF position.

10. The tap off box of claim 1, wherein the breaker actuators are capable of being moved to selectively toggle the respective circuit breaker of the circuit breakers from the ON position to a trip position, and from the OFF position to the trip position.

11. The tap off box of claim 1, comprising an internal wall removably coupled to the housing to encase the circuit breaker within the internal enclosure formed by the housing.

12. The tap off box of claim 11, wherein the internal wall is configured and dimensioned complementary to internal walls of the housing to create a seal with the housing around a perimeter of the internal wall.

13. The tap off box of claim 1, comprising an actuator cover positioned at least partially on the proximal end of each of the breaker actuators.

14. The tap off box of claim 1, comprising a cable seal assembly mounted to the door, the cable seal assembly including a body and one or more sections capable of being selectively removed from the body to accommodate passage of a cable therethrough.

15. A method of controlling a tap off box, comprising:
providing a tap off box including (i) a housing including walls forming an internal enclosure, (ii) circuit breakers disposed within the housing, (iii) a door secured to the housing to define a housing assembly, the housing assembly enclosing the circuit breakers and forming a seal around the circuit breakers that is capable of restricting ingress of dust and liquid into the housing assembly, and (iv) breaker actuators each including a distal end and a proximal end, the distal end coupled to the respective circuit breaker of the circuit breakers within the housing assembly, and the proximal end extending outside of the housing assembly; and
moving the breaker actuators at the proximal end to selectively toggle the respective circuit breaker associated with the breaker actuator from at least an ON position to an OFF position without compromising the seal formed by the housing assembly around the circuit breakers.

16. The method of claim 15, wherein the breaker actuators are moved at the proximal end to selectively toggle the respective circuit breaker of the circuit breakers from at least the ON position to the OFF position without removing the door from the housing.

17. A busway system, comprising:
a busway; and
a tap off box configured to be electrically and mechanically coupled to the busway, the tap off box including:
a housing including walls forming an internal enclosure;
circuit breakers disposed within the housing;
a door secured to the housing to define a housing assembly, the housing assembly enclosing the circuit breakers and forming a seal around the circuit breakers that is capable of restricting ingress of dust and liquid into the housing assembly;
breaker actuators each including a distal end and a proximal end, the distal end coupled to the respective circuit breaker of the circuit breakers within the housing assembly, and the proximal end extending outside of the housing assembly;
wherein the breaker actuators are capable of being moved at the proximal end to selectively toggle the respective circuit breaker associated with the breaker actuator from at least an ON position to an OFF position without compromising the seal formed by the housing assembly around the circuit breakers.

18. The busway system of claim 17, wherein the busway includes an open channel extending along a bottom surface of the busway, and wherein the tap off box includes a power distribution paddle head disposed outside of the housing assembly and including cables extending into the housing assembly, the cables electrically coupled to the circuit breakers.

19. The busway system of claim 18, wherein the power distribution paddle head is configured to be at least partially inserted into the open channel of the busway, and the paddles are configured to electrically engage with phase conductors of the busway.

20. The busway system of claim 19, comprising an end feed coupled to an end of the busway, the end feed supplying power to the busway and to the tap off box.

* * * * *